(12) United States Patent
Pinney et al.

(10) Patent No.: US 11,493,547 B2
(45) Date of Patent: Nov. 8, 2022

(54) SYSTEM AND METHOD FOR POWER TRANSMISSION LINE MONITORING

(71) Applicant: LineVision, Inc., Somerville, MA (US)

(72) Inventors: Nathan Douglas Pinney, New Albany, IN (US); Thomas Anderson McChesney, Lexington, KY (US); Elliott J. Gould, Somerville, MA (US)

(73) Assignee: LineVision, Inc., Somerville, MA (US)

( * ) Notice: Subject to any disclaimer, the term of this patent is extended or adjusted under 35 U.S.C. 154(b) by 0 days.

(21) Appl. No.: 17/167,927

(22) Filed: Feb. 4, 2021

(65) Prior Publication Data

US 2021/0215751 A1    Jul. 15, 2021

Related U.S. Application Data

(62) Division of application No. 16/257,991, filed on Jan. 25, 2019, now Pat. No. 10,948,531.

(60) Provisional application No. 62/622,603, filed on Jan. 26, 2018.

(51) Int. Cl.

| | |
|---|---|
| *G01R 31/08* | (2020.01) |
| *G01B 11/02* | (2006.01) |
| *G01B 11/06* | (2006.01) |
| *G01P 5/02* | (2006.01) |
| *G01R 29/08* | (2006.01) |
| *G01R 21/01* | (2006.01) |
| *G01S 17/50* | (2006.01) |
| *G01W 1/00* | (2006.01) |

(52) U.S. Cl.
CPC .......... *G01R 31/085* (2013.01); *G01B 11/026* (2013.01); *G01B 11/0616* (2013.01); *G01P 5/02* (2013.01); *G01S 17/50* (2013.01); *G01W 1/00* (2013.01); *G01R 21/01* (2013.01); *G01R 29/085* (2013.01)

(58) Field of Classification Search
CPC .... G01R 31/085; G01R 21/01; G01R 29/085; G01B 11/026; G01B 11/0616; G01B 11/24; G01P 5/02; G01S 17/50; G01W 1/00
USPC ......................................................... 324/539
See application file for complete search history.

(56) References Cited

U.S. PATENT DOCUMENTS

| | | | |
|---|---|---|---|
| 5,745,016 A * | 4/1998 | Salminen ................. | G01R 1/24 333/17.1 |
| 6,097,298 A | 8/2000 | Brown | |
| 6,205,867 B1 * | 3/2001 | Hayes ...................... | H02G 7/02 73/862.391 |

(Continued)

FOREIGN PATENT DOCUMENTS

| CA | 2267912 | 8/1999 |
|---|---|---|
| CN | 101922924 A | 12/2010 |

(Continued)

OTHER PUBLICATIONS

Douglass, D.A., et al., "Real-Time Overhead Transmission Line Monitoring for Dynamic Rating," IEEE Transactions on Powr Delivery, 31(3): 921-927 (2016).

(Continued)

*Primary Examiner* — Christopher P McAndrew
(74) *Attorney, Agent, or Firm* — HoustonHogle LLP

(57) ABSTRACT

A transmission line monitoring system and central processing facility are used to determine the geometry, such as a height, of one or more conductors of a power transmission line and real-time monitoring of other properties of the conductors.

13 Claims, 11 Drawing Sheets

(56) References Cited

U.S. PATENT DOCUMENTS

| | | | |
|---|---|---|---|
| 6,714,000 B2 | 3/2004 | Staats | |
| 6,771,058 B2 | 8/2004 | Lapinksi et al. | |
| 8,280,652 B2 | 10/2012 | Syracuse et al. | |
| 9,488,670 B2* | 11/2016 | Chan | G01P 15/00 |
| 9,519,014 B2* | 12/2016 | Aaserude | H02J 3/00 |
| 9,915,640 B2 | 3/2018 | Pruente et al. | |
| 10,699,347 B1* | 6/2020 | Slusar | G01C 21/3461 |
| 2003/0098683 A1 | 5/2003 | Lapinksi et al. | |
| 2006/0125469 A1 | 6/2006 | Hansen | |
| 2008/0012720 A1* | 1/2008 | Rostron | G01R 15/14 |
| | | | 361/1 |
| 2009/0108840 A1* | 4/2009 | Givens | G01R 29/085 |
| | | | 324/629 |
| 2010/0198775 A1* | 8/2010 | Rousselle | A01B 79/005 |
| | | | 706/54 |
| 2010/0214094 A1* | 8/2010 | Givens | E02F 9/24 |
| | | | 340/3.7 |
| 2011/0238374 A1 | 9/2011 | Lancaster | |
| 2012/0019622 A1* | 1/2012 | Rousselle | H02G 1/02 |
| | | | 348/46 |
| 2012/0027298 A1* | 2/2012 | Dow | G01C 5/00 |
| | | | 382/173 |
| 2013/0066600 A1* | 3/2013 | Rousselle | H02J 3/00 |
| | | | 703/1 |
| 2014/0021327 A1 | 1/2014 | Hyde et al. | |
| 2014/0180616 A1 | 6/2014 | Aaserude et al. | |
| 2015/0160340 A1* | 6/2015 | Grauer | G01S 7/4802 |
| | | | 356/5.04 |
| 2015/0353196 A1* | 12/2015 | van Cruyningen | |
| | | | G01R 29/0878 |
| | | | 701/2 |
| 2016/0164573 A1* | 6/2016 | Birk | H02J 13/00017 |
| | | | 375/257 |
| 2016/0178688 A1* | 6/2016 | Hou | G01R 31/083 |
| | | | 324/527 |
| 2016/0216304 A1* | 7/2016 | Sekelsky | B64C 39/024 |

FOREIGN PATENT DOCUMENTS

| | | |
|---|---|---|
| CN | 101975565 A | 2/2011 |
| CN | 102638013 | 8/2012 |
| CN | 202676156 | 1/2013 |
| CN | 103090807 | 5/2013 |
| CN | 103196380 A | 7/2013 |
| CN | 203084193 | 7/2013 |
| CN | 101552589 | 9/2015 |
| CN | 106932084 | 7/2017 |
| CN | 107179056 A | 9/2017 |
| DE | 102007059165 A1 | 5/2009 |
| JP | 2001321828 A | 11/2001 |
| WO | WO 2013033576 A1 | 3/2013 |

OTHER PUBLICATIONS

Eckroad, S., "Video Sagometer Application Guide," EPRI, Palo Alto, CA: 2001. 1001921.

El Gayar, A.I., et al., "Wind-Induced Clearances Infrigement of Overhead Power Lines," IJCEE, 6(4): 275-282 (2014).

Khawaja, A.H., et al., "Monitoring of Overhead Transmission Lines—A Review from Perspective of Contactless Technologies," Sensing and Imaging an Interntional Journal, 1-14 (2017).

Marmillo, J., et al., "Simulating the Economic Impact of a Dynamic Line Rating Project in a Regional Transmission Operator (RTO) Environment," CIGRE US National Committee 2018 Grid of the Future Symposium, 1-8 (2018).

Phillips, A., "Evaluation of Instrumentation and Dynamic Thermal Ratings for Overhead Lines," Electric Power Research Institute, i-A31 (2011).

International Search Report and Written Opinion, dated Apr. 17, 2019, from International Application No. PCT/US2019/015194, filed on Jan. 25, 2019. 16 pages.

International Preliminary Report on Patentability, dated Aug. 6, 2020, from International Application No. PCT/US2019/015194, filed on Jan. 25, 2019. 10 pages.

Keyhan, H., et al., "Dynamic Analysis of an Overhead Transmission Line Subject to Gusty Wind Loading Predicted by Wind-Conductor Interaction," Computers and Structures, 122: 135-144 (2013).

* cited by examiner

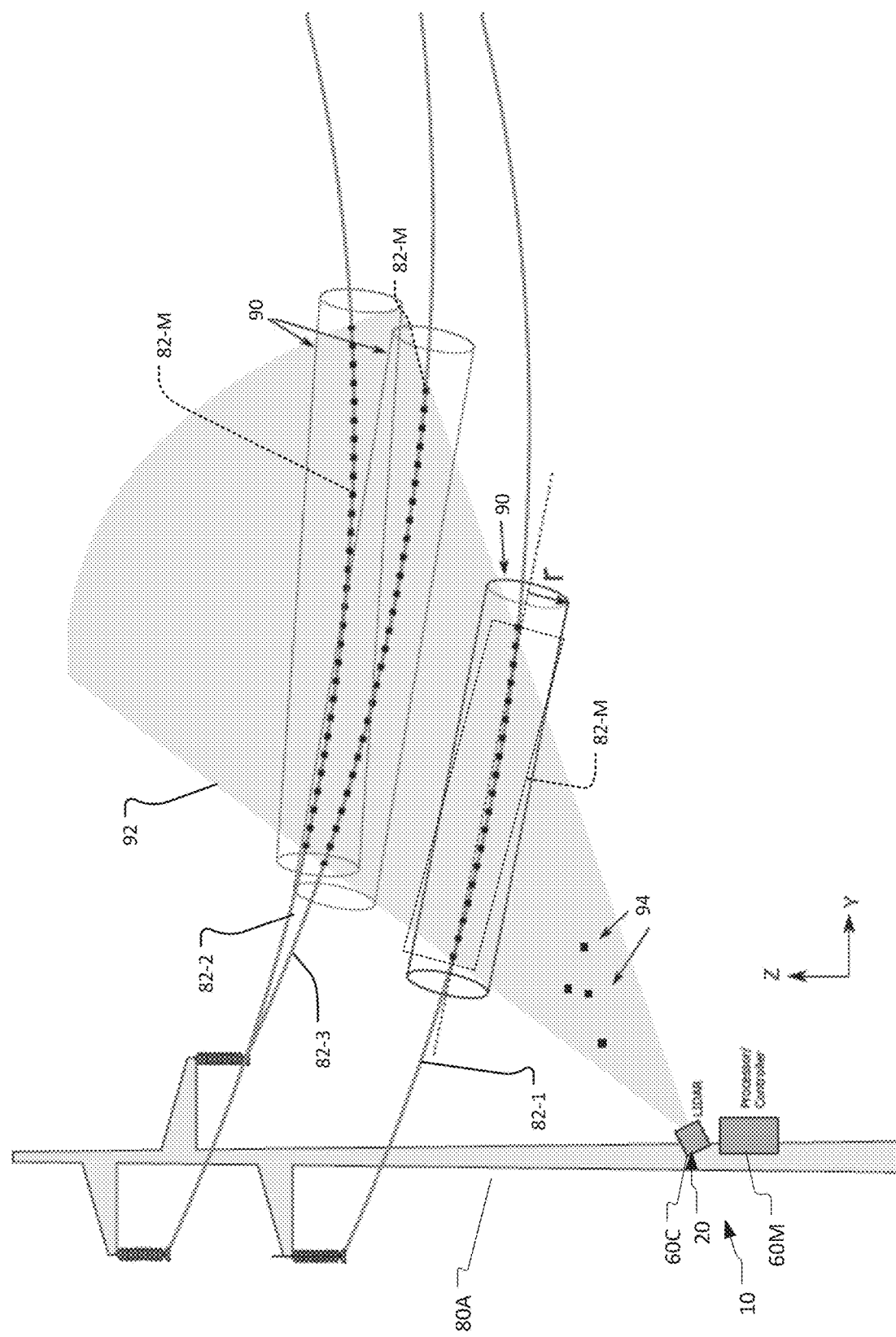

SYSTEM AND METHOD FOR POWER TRANSMISSION LINE MONITORING

RELATED APPLICATIONS

This application is a Division of U.S. patent application Ser. No. 16/257,991, filed on Jan. 25, 2019, which claims the benefit under 35 USC 119(e) of U.S. Provisional Application No. 62/622,603, filed on Jan. 26, 2018, both of which are incorporated herein by reference in their entirety.

BACKGROUND OF THE INVENTION

A typical overhead power transmission line consists of three energized phase conductors, consisting of a single stranded cable or of two or more stranded sub-conductors arranged in a bundle, and one or more non-energized overhead ground wires (OHGW), separated from each other in a spatial configuration and running between transmission line (or support) towers. Conductors are typically composed of strands of steel, aluminum, copper, alloyed metals, or carbon composite materials, with various surface treatments applied to achieve desired corrosion resistance (e.g. zinc galvanization), optical, and other properties. Each conductor often carries a different phase of the power transmitted through the line, and the total power flowing through the transmission line is the summation of the power flowing through each of the three phases. Conductor bundles typically consist of two to four conductors connected by spacers. In the discussion that follows, conductor bundles will be simply referred to as "conductors," which shall be understood to refer to the medium of a transmission line that carries the phases of the power flowing through the transmission line. The conductors making up each transmission line may carry alternating current (AC) and voltage at a specific frequency (60 Hz in the United States, 50 Hz in Europe), direct current (DC) and voltage, or may be de-energized during construction, maintenance, or emergency outage periods.

Conductors do not extend between towers in a straight line, but rather, a conductor takes the shape of a catenary between two adjacent towers. In this regard, "sag" is provided in the conductor to lessen the amount of mechanical tension in the power transmission line. Sag is generally defined as the difference in height where the conductor is connected to the towers as compared to the lowest point of the conductor between two adjacent towers. With too little sag, the tension may be too great and the conductor could fracture due to tensile stresses, or the conductor could suffer excessive aeolian and other vibrations, also leading to fracture caused by material fatigue of conductor strands. With too much sag, the length of the conductor is increased, and cost is thus increased. Furthermore, with too much sag, the conductor may swing outward at higher amplitudes in the wind and could thus contact or flash-over to other conductors, tower structures, or other nearby objects, for example trees or buildings.

Time-variant electrical operating conditions and weather conditions also impact the sag of the conductor. Indeed, the hanging catenary conductor represents a thermo-mechanical system, in which the conductor has interrelated average temperature, tension, and sag. As the conductor is heated by warm air, sunlight, or electric resistive heating, lengthwise thermal expansion of the conductor material causes a lengthening and de-tensioning of the conductor, resulting in a decreased ground clearance (increased sag). When the conductor is cooled by weather (cool air, wind, emitted blackbody radiation, or precipitation), lengthwise thermal contraction increases tension and reduces sag. The interrelationship between tension, temperature, and sag means that a measurement or determination of any one of these variables enables one to calculate either or both of the other variables by using thermo-mechanical models.

SUMMARY OF THE INVENTION

An apparatus made in accordance with the present invention is used to determine the geometry, such as a height, or three-dimensional catenary shape, of one or more conductors of a power transmission line, but typically without contact with or direct mechanical contact to the conductors. Furthermore, the apparatus and method of the present invention allows for the continuous and real-time monitoring of the height and other properties of the conductors.

In general, according to one aspect, the invention features a transmission line monitoring system comprising a LIDAR based clearance sensor.

In general, according to another aspect, the invention features a method for generating a transmission line power measurement, comprising measuring an electric and/or magnetic field of a transmission line, measuring a position of the transmission line, and using the position to improve an estimation of the power being transmitted by the transmission line from the electric and/or magnetic field measurement.

In general, according to another aspect, the invention features a system for generating a transmission line power measurement, comprising one or more electromagnetic field sensors for measuring an electric and/or magnetic field of a transmission line, a clearance sensor measuring a position of the transmission line, and a computer that uses the measured position to improve an estimation of the power being transmitted by the transmission line from the electric and/or magnetic field measurement.

In general, according to another aspect, the invention features a method for detecting a possible anomaly in connection with a transmission line, comprising measuring an electric and/or magnetic field near a transmission line, characterizing a weather surrounding the transmission line, estimating the conductor temperature of the transmission line using a first measurement process based on the weather and the measured electric and/or magnetic field, measuring a position and/or sag of the transmission line, estimating the conductor temperature of the transmission line using a second measurement process from the measured position/sag, and determining an anomalous condition based on comparison of the conductor temperatures derived from the first and second measurement processes.

In general, according to another aspect, the invention features a system for detecting a possible anomaly in connection with a transmission line, comprising one or more electromagnetic field sensors for measuring an electric and/or magnetic field near a transmission line, a computer for estimating the conductor temperature of the transmission line using a first measurement process based on weather information and the measured electric and/or magnetic field, and a clearance sensor measuring a position and/or sag of the transmission line. Here, the computer estimates the conductor temperature of the transmission line using a second measurement process from the measured position/sag and determines an anomalous condition based on comparison of the conductor temperatures derived from the first and second measurement processes.

In general, according to another aspect, the invention features a method for detecting wind conditions in connection with a transmission line comprising measuring a position of the transmission line and estimating the wind conditions based on the measured position.

In general, according to another aspect, the invention features a system for detecting wind conditions in connection with a transmission line, comprising a clearance sensor for measuring a position of the transmission line and a computer for estimating the wind conditions based on the measured position of the transmission line.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 5 is a schematic view showing a transmission line tower carrying a span and being monitored by the transmission line monitoring system showing a conductor search scheme employed by the controller of the system;

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
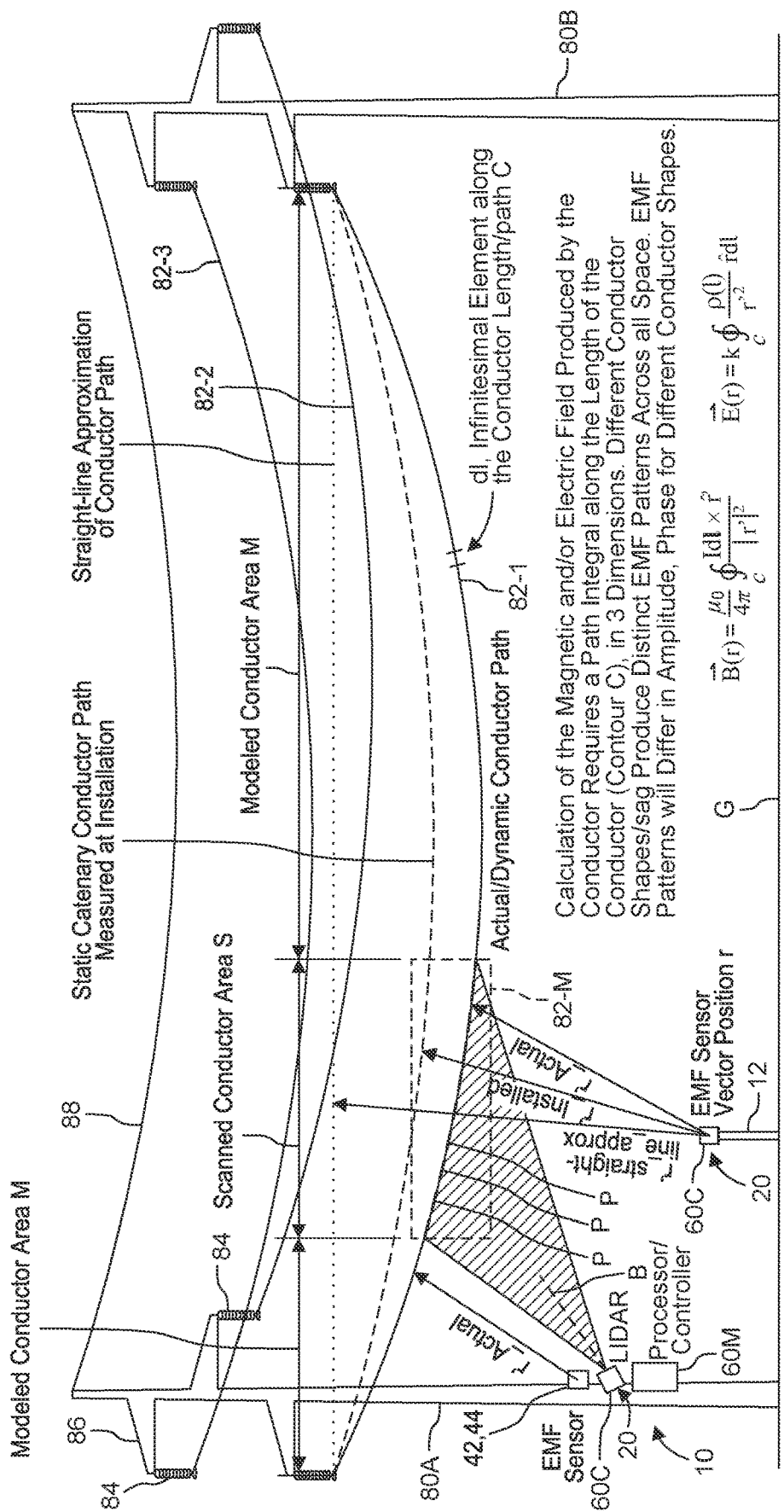
FIG. 1 is a schematic view showing transmission line towers carrying a transmission line span on which a transmission line monitoring system has been mounted according to the present invention.

FIG. 1 shows exemplary transmission line towers 80A, 80B supporting a span of three conductors 82-1, 82-2, 82-3 of a power transmission line. The conductors are hung from insulator strings 84 that connect to insulator supports 86 of the tower 80. Commonly, an overhead ground wire (OHGW) 88 is also provided for lightning protection, for example.

The invention concerns a transmission line monitoring system 10 that monitors those conductors 82 and the electricity carried by the conductors. In the illustrated example, the transmission line monitoring system 10 is deployed in a main enclosure 60M, which includes a controller 50 and possibly a power system. One or more EMF sensors 42, 44 are mounted to the tower 80 to monitor the electromagnetic field (EMF) around the conductors 82. Additional one or more sensor enclosures 60C are also often provided for one or more clearance sensors 20 for monitoring the geometry of the conductors 82. The EMF sensors 42, 44 and sensor enclosure(s) 60C are connected to the main enclosure 60M typically with weatherproof wiring harnesses providing control, data transfer and power.

Often a sensor articulation system mounts to the tower 80, or a nearby separate mounting pole or other structure 12, and carries the clearance and/or EMF sensors 20 of the transmission line monitoring system 10. Preferably, the sensor articulation system includes adjustable angle brackets, sliding mounts, rotating mounts, and other position-adjustment mechanisms that enable the clearance sensors 20 to be aimed accurately at the overhead conductors/wires given a variety of ground-based or tower-based mounting locations and mounting types (pole, cabinet, vault, wall, roof, power transmission structure base, tripod, etc.). The articulation system may be adjusted and fixed in place once at installation or again during maintenance, or continuously and autonomously adjusted by motors or other electromechanical devices. In general, the sensor articulation system is installed on a transmission structure pole/leg at a distance often no greater than 35 meters and typically between 10 and 50 meters, line of sight distance, from the monitored conductors 82. The articulation system often allows the boresight B of the clearance sensor system 20 to be aimed upward at the conductors. Specifically, the clearance sensor system 20 is angled to scan the conductors between 30 degrees and 90 degrees above horizontal.

In the illustrated embodiment, one or more EMF sensors 42, 44 of the transmission line monitoring system 10 are installed away from the main housing 60M of the monitoring system 10 and possibly in proximity to the different conductors 82. The placement of EMF sensors can be optimized based on electromagnetic field models to provide ideal signal-to-noise or isolation between the EMF signals associated with different conductors or different three-phase circuits.

In the illustrated example, the clearance sensor 20 detects the position of all of the conductors 82-1, 82-2, 82-3, and OHGW 88. The figure shows the scanning of the exemplary conductor 82-1 within the scanned conductor area S. The points P in box 82-M represent actual measured data from the scanning of the clearance sensor 20. These points are used to extrapolate the conductor into the modeled conductor areas M on either side of the scanned conductor area S.

Figure 2:
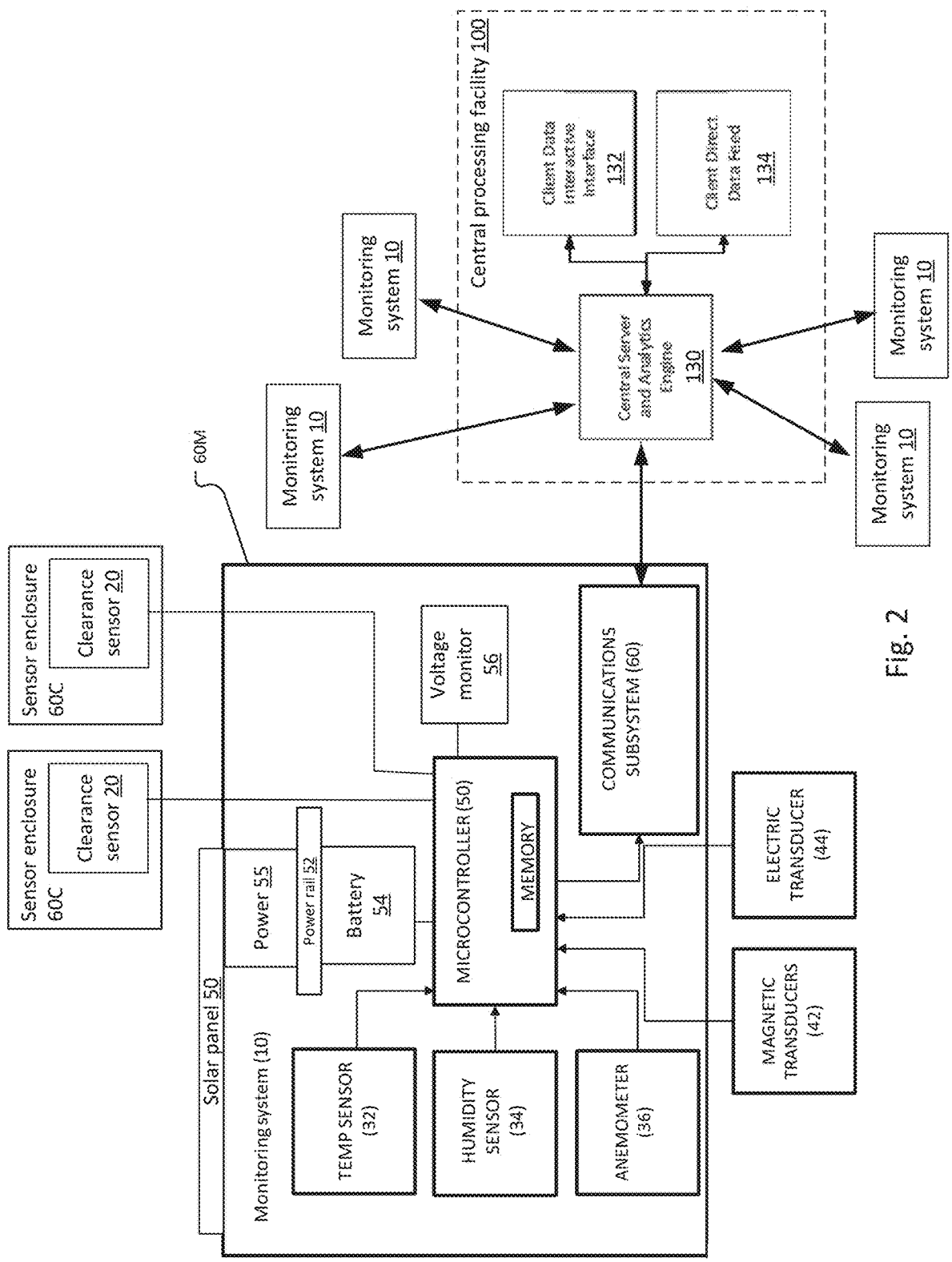
FIG. 2 is a schematic diagram showing the transmission line monitoring systems communicating with a central processing facility.

FIG. 2 is a schematic diagram showing the transmission line monitoring system 10.

Typically, the monitoring system 10 will be powered by a rechargeable battery 54 that is located within the main housing 60M or a separate housing. Power from the battery is distributed to the electronic components of the monitoring system 10 such as a microcontroller 50 via a power rail 52. In a preferred embodiment, the battery 54 is recharged by a solar panel 50, electrochemical fuel cell, and/or mains power supply where available. A power management system 55 controls the charging of the battery 54 and possibly conditions the power delivered to the system's components. Typically, the power management system 55 also distributes the power to the clearance sensors 20 and EMF transducers 42, 44 via the respective wiring harnesses. A battery voltage monitor 56 monitors the voltage of the battery 54 and passes this information to the controller 50.

The monitoring system 10 includes the one or more clearance sensors 20, typically installed within separate sensor housings 60C for detecting the position of one or more conductors 82 of the power transmission line. In most embodiments, the one or more clearance sensors 20 are positioned at a predetermined initial distance from, but not in physical contact with, the one or more conductors 82. The one or more clearance sensors 20 are then mounted at or near ground level under the power transmission line or on structures (e.g., pole, tower leg) that are near but not in electrical contact with the conductors of the power transmission line. By not requiring direct electrical or mechanical contact with the conductors, the clearance sensors 20 may be placed in a greater variety of positions, and do not compromise or otherwise impact the mechanical or electrical integrity or behavior of the monitored conductors.

Multiple types of clearance sensors may be used and incorporated into the transmission line monitoring system 10 for this purpose, including, but not limited to: (i) Frequency Modulated Continuous Wave (FMCW) RADAR sensors; (ii) laser rangefinder or LIDAR sensors, which relies on laser pulses and time-of-flight (ToF) analysis; (iii) ultrasonic rangefinder and/or level-detection sensors, which emit a high-frequency sound pulses and then listen for the reflection of the pulses off of the target object; and (iv) cameras or other optical sensors. Attachment of additional hardware (e.g. reflector targets, RF resonators, RFID tags etc.) to the monitored conductors is typically not necessary, as each sensor type can detect the position of an unmodified conductor. Modification of the surface coating of the conductor may be required in special circumstances to alter the optical properties of the conductor surface to improve sensor signal quality.

The microcontroller 50 of the transmission line monitoring system 10 receives the data from the one or more clearance sensors 20 executes instructions stored in a memory component or other computer-readable medium to perform certain conditioning operations on the received data from the one or more clearance sensors 20 to generate a digital data stream. Generally, the microcontroller 50 is a computer system implemented on a compact integrated circuit that includes a processor, memory and input/output (I/O) peripherals on a single chip. In other examples, a more general controller could be used such as a 'single board computer' style controller could be used in which one or more microprocessors) memory, input/output (I/O) and other features required of a functional computer are implemented on a common board.

The resultant digital data stream is then analyzed to, among other things, (i) determine a position of the one or more conductors of a power transmission line, and then (ii) determine the height of each of the one or more conductors relative to an underlying ground surface, (iii) the motion and horizontal displacement of one or more conductors from a hanging rest position ("blowout"), and (iv) the minimum inter-conductor distances in cases where multiple conductors are present. Of course, such analysis is preferably achieved through the use of a digital computer program (i.e., computer-readable instructions executed by a processor of a computer) that includes appropriate modules for executing the requisite instructions (which are stored in a memory component or other computer-readable medium). As described below, such analysis can be carried out at a central server system and analytics engine 130, or, in some embodiments, such analysis may be carried out locally via the microcontroller 50 or another computer or the processing can be distributed between two or more of these computers.

Generally, the microcontroller 50 is a microprocessor, processor implemented in a field programmable gate array (FPGA), or other computer-based system 50 that collects digital and analog sensor data streams and organizes the resulting digital data, performs basic signal conditioning and logical operations based on sensor data values/quality, and then assembles data for transmission to the central processing facility 100. The microcontroller 50 is also capable of receiving reprogramming or re-parameterization instructions from the central processing facility 100 when a sensor or analysis configuration changes are required. Configuration adjustments may be accomplished by human analyst action, or by automated algorithmic means based on system calculation results. The conductor geometry data is then communicated to interested parties, or the determined conductor geometry data can be used in subsequent calculations and analysis, as further described below.

The transmission line monitoring system 10 also preferably includes certain auxiliary sensors for sensing or measuring environmental conditions in the vicinity of the power transmission line, including, for example, a temperature sensor 32 for sensing ambient air temperature, a humidity sensor 34 for sensing the humidity level of the air, and/or an anemometer 36 for detecting wind speed. Furthermore, in this exemplary embodiment, the apparatus 10 also includes electromagnetic field (EMF) sensors such as one or more magnetic transducers 42 for sensing the AC or DC vector magnetic field associated with the conductors 82 of the power transmission line and an electric field transducer 44 for sensing the AC or DC electric field associated with the conductors 82 of the transmission line. (The use of such magnetic transducers 42 and an electric transducer 44 to determine a net flow of current and power through a transmission line is described in U.S. Pat. Nos. 6,714,000 and 6,771,058, which are incorporated herein by reference.)

Data from all such auxiliary sensors, whether environmental data and/or operational data, is also communicated to and received by the microcontroller 50, which again preferably executes instructions stored in a memory component or other computer-readable medium to perform certain conditioning operations on the received data. The data from these auxiliary sensors, alone or in combination with the data from the clearance sensors, can then be used as part of a refined analysis of the conductors of a power transmission line, as further described below.

The transmission line monitoring system 10 also includes a communications subsystem 60 for transmitting data. Such a communications subsystem 60 may be comprised of one or more modems, radios, communication cables, local data ports, or other suitable means for transmitting data. In this exemplary embodiment, it is contemplated that the communications subsystem 60 would transmit the conditioned data from the microcontroller 50 to the central processing facility 100 and specifically its central server system and analytics engine 130 (which also may be termed a "central server and analytics engine"), where the final steps of determining the position of one or more conductors of the power transmission line and determining an approximate height of each of the one or more conductors relative to an underlying ground surface G would be carried out.

Generally, the communications subsystem 60 comprises one or more wireless modems, transceiver radios, communication cables, or local data ports (e.g. USB) used to transport data from the microcontroller 50 to central server 100 or a portable computing device, laptop computer, of a technician. Cellular and satellite modems, and licensed and unlicensed radio modems are example manifestations of the communications subsystem. The communications subsystem is typically two-way, and is capable of encrypted or encoded data transmission for security and data privacy purposes.

In more detail, the communications subsystem 60 includes one or more onboard cellular and/or satellite modems transmit sensor data to the central processing facility 100, where additional advanced analytics and monitoring process analytics are performed. Preferably a cellular modem is used. Various third-party cellular modem modules/gateways are configured for global use on major carrier networks. Another option is a satellite modem: For certain remote deployments outside of cellular network coverage, Iridium® satellite communications equipment can be specified. In addition, antennas such as omnidirectional and/or directional (e.g., Yagi) antennas are part of the communication subsystem 60. Typically, they are specified to suit local signal strength and direction requirements. Additional options are the ISM bands (e.g. 900 MHz) or licensed-band private radio communications.

Furthermore, as mentioned above, the transmission line monitoring system 10 not only allows for determination of the height of one or more conductors of a power transmission line, but it also allows for the continuous and real-time monitoring of other properties of the conductors and their environment that inform human observers about the performance, safety, and material condition of the power transmission line. The most common manifestation of actionable real-time performance information is in the computation of Dynamic Line Ratings (DLR), which represent maximum hypothetical current loadings on the conductors, in response to weather conditions, above which conductor overheating may occur. By calculating a DLR that is based on real-time operating conditions and conductor performance, more-accurate ratings can be used and factored into scheduled power market generator dispatch, enabling increased use of existing transmission capacity. Furthermore, long-term monitoring of conductor sag, temperature, current loading, and mechanical cycling can help asset owners decide whether conductors can be operated more aggressively than previously assumed, or whether they are reaching end-of-life due to mechanical stresses and associated material degradation (e.g., creep, corrosion).

An exemplary method in accordance with the present invention generally comprises the steps of: (a) positioning one or more sensors for detecting a position and/or three-dimensional geometric shape of the one or more conductors of the power transmission line, with the one or more sensors positioned at a predetermined initial distance from the one or more conductors and tower/insulator structures; (b) receiving, via a processor of a computer, data from the one or more sensors to generate a digital data stream; (c) analyzing, via the processor of the computer, the digital data stream to (i) determine a position of the one or more conductors of the power transmission line, and then (ii) determine the sag and/or height of each of the one or more conductors relative to an underlying ground surface, as well as the three-dimensional geometric shape of the conductors, the minimum inter-conductor spacing between pairs of conductors; and (d) communicating the height to an interested party.

Another exemplary method in accordance with the present invention generally comprises the steps of: (a) positioning one or more sensors for detecting a position of one or more conductors of the power transmission line, with the one or more sensors positioned at a predetermined initial distance from the one or more conductors; (b) receiving, via a processor of a computer, position data from the one or more sensors; (c) positioning at least one auxiliary sensor for (i) sensing or measuring an environmental condition in the vicinity of the power transmission line, or (ii) sensing or measuring an operating condition in the vicinity of the power transmission line; (d) receiving, via the processor of the computer, auxiliary data from the auxiliary sensor; and (e) analyzing, via the processor of the computer, the position data and the auxiliary data to (i) determine a position of the one or more conductors of the power transmission line, (ii) determine the sag and/or height of each of the one or more conductors relative to an underlying ground surface, and (iii) to monitor performance of the power transmission line.

The microcontroller 50 communicates with the central server and analytics engine 130 of the central processing facility 100 using its communications subsystem 60. At the same time, the central processing facility 100 also communicates with other monitoring systems 10 at different positions and/or different towers of the power transmission line and monitoring systems on other power transmission lines.

The central server and analytics engine 130 then provides a client data interactive interface 132 and in a preferred embodiment also provides direct data feeds 134 to a clients' asset management and power transmission line monitoring and control system.

The central server and analytics engine 130, client data interactive interface 132, and the client direct data feeds 134 represent functions performed by one or more computer systems, which can be implemented a number of ways. Typically, the central server, interface and data feeds execute on one or more computer systems including application servers, each with one or more central processing units, memory and disk or solid state non-volatile drives, in some examples. In other cases, the engine, interface and feeds are implemented on an on-demand cloud computing platform to which subscribers deploy virtual clusters of computers, through the Internet.

A number of different technologies could be employed to implement the clearance sensor(s) 20. This sensor function can be manifested as one or more of a suite of sensor types sharing the common capability of measuring the height of a substantially horizontal conductor above the ground, or another fixed point of reference relative to the wire/conductor. Overhead conductor heights are measured within distance of 5-100 meters, typically, with desired accuracy of 1-2 cm. These sensors are intended to be placed on fixed-position mounts at or near ground-level, or on structures (e.g. pole, tower leg) that are not in electrical contact with energized overhead wires. Conductor clearance can be referred to inversely as conductor sag, or the displacement of a hanging conductor below the fixed mounting points on either end of the hanging wire assembly.

In one implementation, the clearance sensor 20 is a FMCW Radar (Frequency Modulated Continuous Wave Radar) sensor. This type of device is typically used for level-detection and ranging of solids and liquids in silos, tanks, pools, etc.

Figure 3:
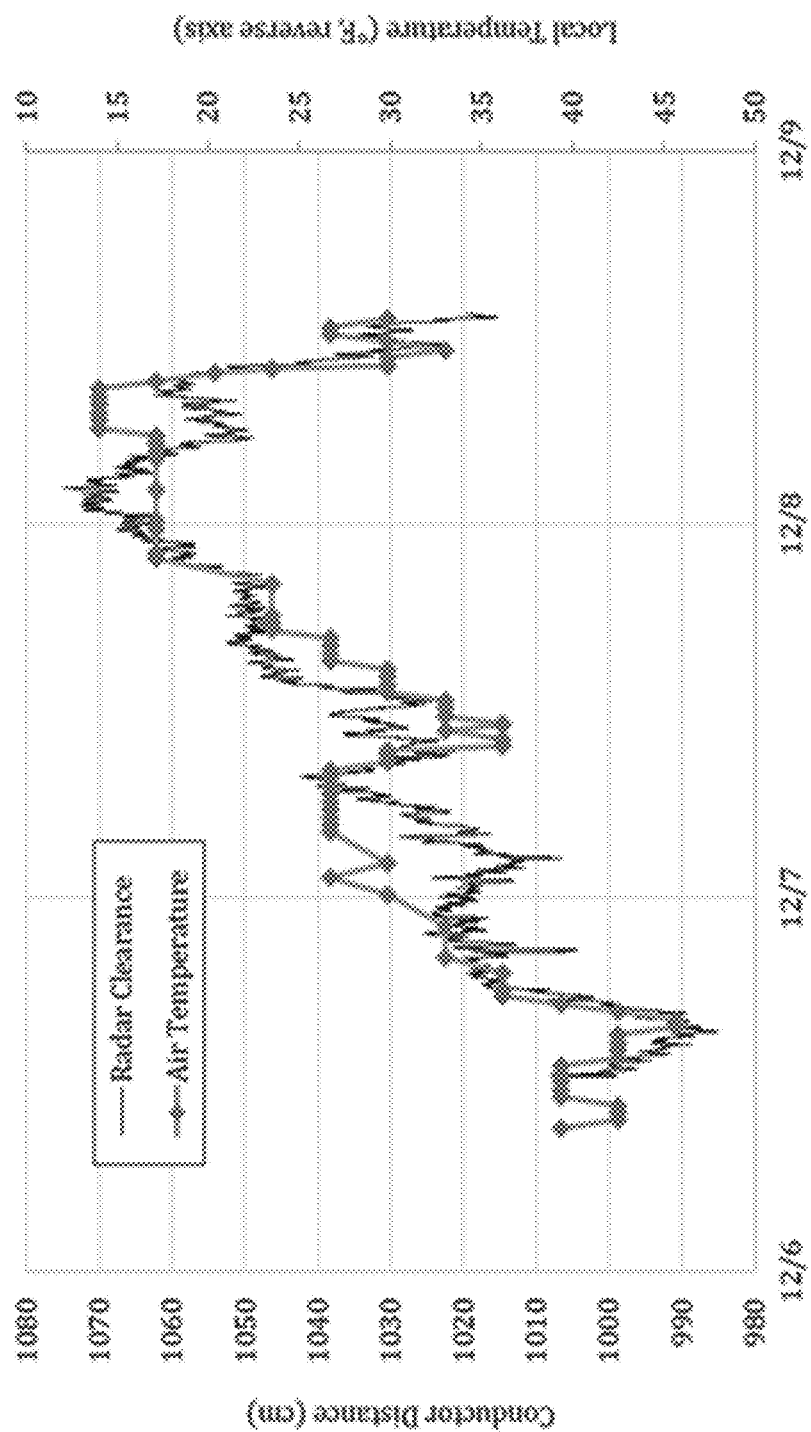
FIG. 3 is a plot of conductor distance in centimeters and local temperature in degrees Fahrenheit as a function of time, measured in days for a RADAR based clearance sensor.

FIG. 3 is a plot of conductor distance in centimeters and local temperature in degrees Fahrenheit as a function of time measured in days. This field-testing data shows overhead conductor clearance measured with a SITRANS LR560 FMCW RADAR system sold by Siemens Aktiengesellschaft. The data shows centimeter scale accuracy, in comparison and correlation with measurement ambient air temperature. For a conductor with relatively low electric current loading, the temperature of the conductor should closely correlate with ambient temperature. Here it is shown that the clearance (and therefore average temperature) of the overhead conductor is highly correlated with ambient temperature over a 48-hour period.

In another implementation, the clearance sensor 20 is a laser rangefinder/LIDAR sensor. Either spinning or stationary single-sensor or multi-sensor array configurations can be used to determine the position and clearance of overhead conductors/wires using laser pulses and time-of-flight (ToF) analysis. For multi-sensor laser/LIDAR configurations, multiple simultaneous measurements of the conductor are made at different points along its length, allowing for a three-dimensional geometric analysis of the conductor shape/position. In addition, laser/LIDAR scans allow for rapid re-scan of the same conductor in repetitive samplings, allowing for analysis of conductor motion (e.g. galloping, aeolian vibration) by comparison of a time-series of scan data taken from the same conductor.

Figure 4B:
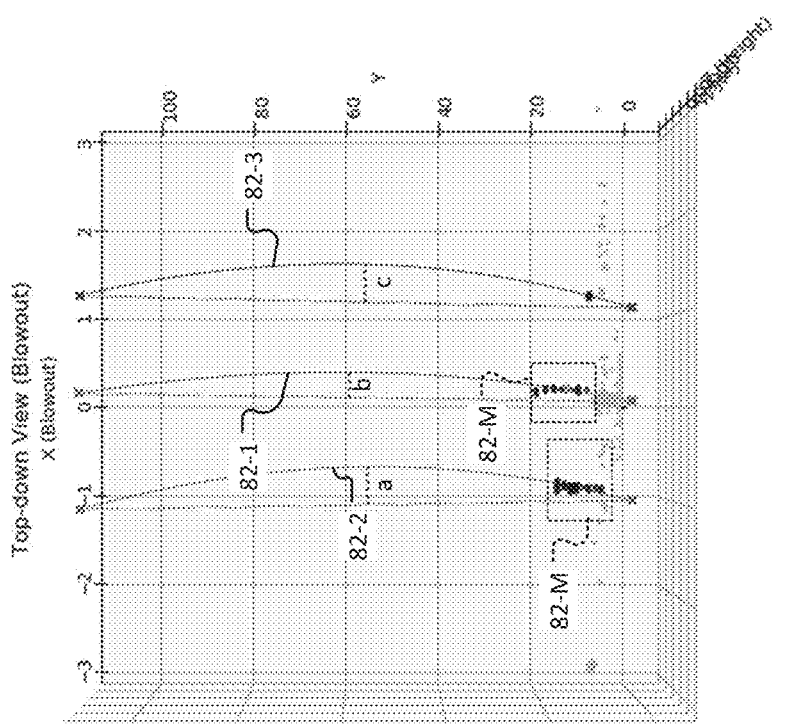
FIGS. 4A and 4B are plots of three conductors in the y-z plane and the y-x plane, respectively, imaged using a LIDAR-based clearance sensor placed near ground level, and showing mathematical lines-of-best-fit that model and extrapolate the conductor shape from actual measured point cloud data.
Figure 4A:
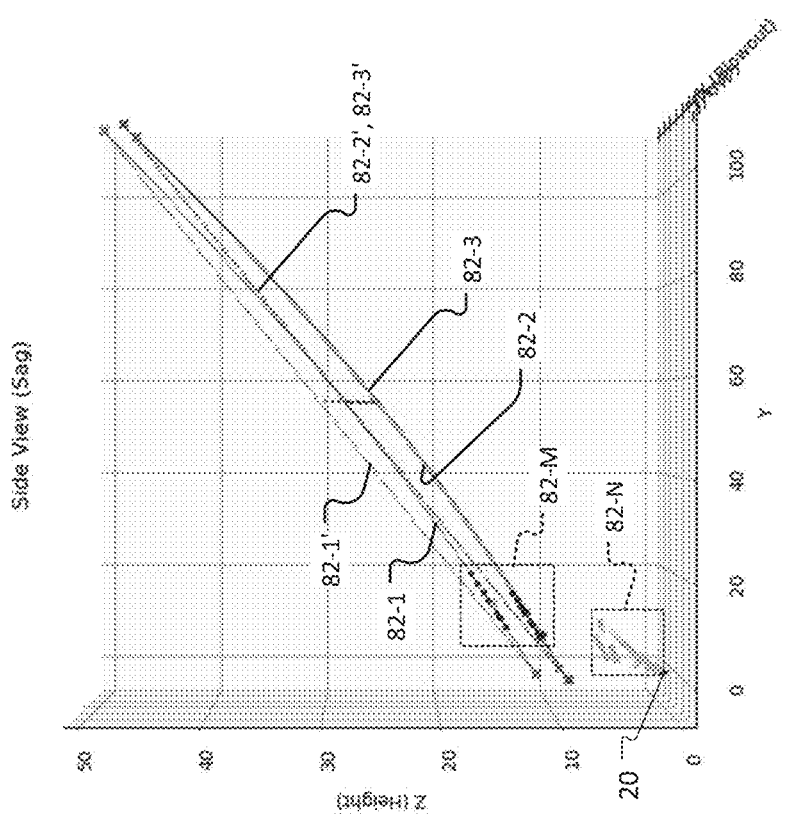

FIGS. 4A and 4B plot the LIDAR clearance sensor data for the example of three-phase transmission circuit conductors imaged using a LIDAR sensor placed near ground level. Note, the data was collected from an inclined span that ascends a mountain. FIG. 4A plots the data in the y-z plane, and FIG. 4B plots the data in the x-y plane, in which the z-axis represents height, the y-axis runs horizontally along the length of the conductors, and the x-axis is the lateral direction.

The points in box 82-M represent actual measured data from the scanning of the LIDAR clearance sensor 20. These are discrete points illustrating the three-dimensional point cloud measurements collected from the multi-channel LIDAR, in which each channel scans at a fixed elevation angle relative to the rotation axis of the spinning LIDAR.

The points in box 82-N represent points detected by the scanner that are not associated with the desired conductor measurements. These points are disregarded as noise.

The lines 82-1, 82-2, 82-3 represent the positions of the conductors extrapolated from the measured data and the known attachments points for the conductors using curve fitting of a catenary (hyperbolic cosine) function. The lines have been fitted to the measured points 82-M using a non-linear least-squares fitting operation. Least-squares fitting of a linear approximation of conductor shape is also possible, and non-linear fits may includecatenary, parabolic, higher-order polynomial, or others, mathematical approximations of the true shape or path of the conductor, Conductor shape models may also be created to reflect standing-wave or other dynamic shape characteristics of a conductor in motion.

The dotted lines 82-1', 82-2', 82-3' represent the hypothetical zero-sag positions of the conductors, forming a straight line between insulator mounting positions.

FIG. 5 illustrates how the controller 50 uses the measured points 82-M corresponding to each of the conductors 82-1, 82-2, 82-3 to resolve the position of the conductors.

In more detail, typically during an initial configuration process, exclusive three dimensional search regions 90 are defined for each of the conductors 82-1, 82-2, 82-3 within the volumetric region 92 that is scanned by the LIDAR clearance sensor 20. Generally, the volumetric region 92 may be configured to scan angles between 30 degrees and 90 degrees above horizontal.

In the illustrated embodiment, these search regions 90 are cylinders that are centered on the anticipated locations of the respective conductors 82-1, 82-2, 82-3.

Generally, these regions 90 may be described by a cylinder, box, or radial distance from a pre calculated or last measured catenary path. In other examples, the regions are defined by a range within a spherical coordinate system. The search regions may be expanded or the regions translated algorithmically by the controller 50 when a suitable conductor is not found or the detected and fitted points sit near the edge of the original search region. This conductor location process may also be performed using advanced analytical processes, for example, computerized pattern recognition, to identify line or catenary shaped patterns in arbitrary point clouds without a preconfigured search region.

Generally, the algorithm should be robust against false returns attributed to snow, rain, dust, leaves, or birds 94 that are also detected as random points that lie within the volumetric region 92 and should be ignored in the conductor fitting process.

In one example, a Hough transform, or other computer pattern-recognition method is employed to find imperfect instances of objects (power line conductors) within a certain class of shapes (catenary shapes) by a voting procedure. The search regions may also be dynamically generated by the controller 50 based on previous results or internal logical operations. Preferably if it did not find enough points, then it expands the search radius.

The LIDAR data is a timeseries of repeated scans. In one example, the controller 50 analyzes the LIDAR data and it timestamps, to resolve and characterize the motion of the conductors 82-1, 82-2, 82-3. This concept is not restricted to LIDAR—the same type of timeseries analysis could apply to the other alternative sensors that detect position of the conductors. Conductor motion is generally undesirable for operators and leads to fatigue/stress/failure and potentially inter-conductor flashover.

In addition, the LIDAR data is also used in some examples to directly measure the thickness of ice formed on the conductors 82-1, 82-2, 82-3. Here, the controller 50 resolves the conductor diameters based on the LIDAR point cloud diameter data itself. If the conductor rapidly becomes wider in the LIDAR data, the controller concludes the existence of ice on the conductors if the ambient air temperature from the temperature sensor 32 indicates that the temperature is below freezing. Then the controller 50 assesses the thickness of the ice based on the wideness of the point cloud distribution is a measurement of the ice thickness.

In addition, the LIDAR data is also used by the controller 50 in some examples to assess and characterize inter-conductor spacing, which is the minimum straight-line distance between the conductors 82-1, 82-2, 82-3. The controller 50 calculates the spacing directly from the 3D geometry model data produced from the LIDAR data, once any two conductors have been measured and their full geometry calculated.

In general, there are safety codes that dictate how close conductors can be to each other, as well as to the ground or other objects. This is especially a concern when two lines are strung on the same structures in an over-under configuration, or when two lines cross paths and one must go over the other.

In another implementation, the clearance sensor 20 is one or more RADAR or ultrasonic sensors. Ultrasonic rangefinder and/or level-detection sensors can be used to determine conductor clearance/height. These sensors work by emitting a high-frequency sound pulse and then listening for the reflection of the pulse off the target object and using ToF analysis to determine distance/height. These sensors should be accompanied by temperature and humidity sensor(s) for calibration and real-time adjustment, because the density of air, and therefore the speed of sound, changes in response to changes in temperature and humidity. An example sensor of this type would be the Siemens Ag Echomax XPS series.

In another implementation, the clearance sensor 20 is a camera/optical sensors. Here, a camera is used to image the overhead conductors/wires relative to a fixed camera viewpoint/viewing angle. By computer-automated image analysis processes executing on an embedded controller in the cameras or on the microcontroller 50, the position of the conductor can be determined. This method has the advantages of being able to image/measure multiple conductors in a single image capture, and the ability to visualize and measure ice/snow accumulation on conductors. Capture of video in short bursts or continuously allows for detection and analysis of conductor motion caused by wind-induced Aeolian vibration, known colloquially as "galloping".

In one example, the one or more cameras will include embedded image analytics systems that will allow the identification of the power transmission lines as foreground objects against the irrelevant background objects such as the sky and clouds in the sky and possibly the sun periodically. The use of visible-light or invisible infrared or ultraviolet flashes, using light-emitting-diode (LED), flashbulbs, or other light sources can be used to assist in the removal of background image artifacts or interference, as foreground objects (such as conductors) will be more significantly illuminated by flashed light than distant objects of typical optical surface reflectivity.

Electric transducers 44 and the magnetic transducers 42, also known collectively as the Electromagnetic Field (EMF) sensor system, is used to measure the magnetic and electric fields emitted or produced by the overhead conductors. These measurements, combined with the measurements from the conductor clearance sensor, allow a highly-accurate calculation of the current and voltage waveforms present on the overhead conductors, based on 3-dimensional modeling of the conductor geometry and the associated EMF patterns. By incorporating the dynamic measured shape of the conductor, obtained from the conductor clearance sensor(s), a more precise and accurate EMF model can be built, with which EMF sensor values can be interpreted with greater accuracy and detail. Electric field sensors are typically plate capacitor or voltage-divider-type sensors. Magnetic transducers 42 also known as Magnetic field sensors, typically include either induction coils or solid-state magnetic field sensor technologies (e.g. Hall-effect sensors, or magnetoresistive sensors).

Weather Sensors, including thermometers/temperature sensors 32 are used for internal calibration and real-time adjustment of other sensor measurements, as many sensors have temperature drift dependencies. Thermometers are used to collect data about ambient air temperature, which is also a key factor in the computation of Dynamic Line Ratings, discussed later. Wind speed and direction sensors (e.g. anemometers 36, including conventional mechanical and ultrasonic types) and solar irradiance/insolation sensors are also used for later computation of Dynamic Line Rating values.

The hardware, electronics, and analytics capabilities described above are used in the measurement of real-time properties and performance of overhead electric power transmission and distribution lines, including energized conductors, de-energized conductors (as during installation or maintenance), and overhead ground wires (OHGW) by the central server 100. By monitoring conditions and performance in real-time, electric grid operators can make adjustments to generator dispatch, line and/or substation switching configurations that have the potential to optimize generation and transmission asset utilization, reduce average electricity prices for end-users, and reduce carbon dioxide, heavy metal, NOx, SOx, and particulate emissions by enabling wider access via the transmission grid to lower-cost and or less-polluting generation sources. The most common manifestation of actionable real-time conductor performance information is in the computation of Dynamic Line Ratings.

Dynamic Line Ratings are computed by the central server 100 described as follows. First, conductor clearance is measured by the Non-contact Clearance Sensor 20 for each monitoring system 10 along a power line. Typically, the central server 100 collects the data from multiple ones of the monitoring systems 10 that are distributed along the length of a power transmission line.

Next, conductor average temperature is computed from the measured clearance (or sag). Each hanging catenary conductor represents a thermo-mechanical system, in which the suspended conductor has interrelated average temperature, length, horizontal tension, and sag. Horizontal tension is typically transferred to neighboring and subsequent spans of the same transmission line where free-swinging suspension insulators are used, and as such the monitored conductor span can be considered as representative of the neighboring spans in terms of thermo-mechanical behavior. As the conductor is heated by weather or electric resistive heating, lengthwise thermal expansion causes a lengthening and de-tensioning of the conductor, resulting in a decreased ground clearance (increased sag). When the conductor is cooled by weather (wind or precipitation), lengthwise thermal contraction increases tension and reduces sag. The interrelationship between tension, temperature, and sag means that a measurement of any one of these variables enables central server 100 to calculate either or both of the other variables by using thermo-mechanical models. Such models can be calculated from engineering models of the conductors, towers, and insulators based on initial specifications, but are often also calibrated or adjusted with empirical measurements of conductor clearance/sag, temperature, and/or tension by the central server 100 to capture changes in mechanical or material properties over time, or to account for uncertainties in initial installation conditions relative to engineering specifications. For example, the engineering documentation might specify that the conductor must be installed at a temperature of 60° F. and a tension of 10,000 lbs, resulting in a sag of 10 feet. However, during installation by linemen crews, the sag and tension can be precisely measured, but the precise temperature of the conductor is unknown or estimated, and the initial sag/tension/temperature relationship may vary from engineering specifications.

Next, conductor or circuit loading, or electrical current flow in Amperes, is computed by the central server 100 using the data collected from the non-contact clearance sensors 20 and the auxiliary EMF sensors 42, 44 of each monitoring system 10. The hanging conductor geometry forms a catenary, having a shape described by the hyperbolic cosine function:

$$z(y) = h = a * \cosh\left(\frac{y - y_0}{a}\right) + z_0$$

where h represents the height of the conductor, y the horizontal position of the conductor along its path, "a" is a parameter that governs the shape or degree of concavity of the catenary shape, and $y_0$ and $z_0$ represent translation offsets of the lowest point of the real conductor relative to the origin, or (x,y,z)=(0,0,0).

The magnetic field emitted by a unit current flow along the overhead conductor path at the position of the EMF sensor device(s) is computed by the central server 100 by performing a numerical path integration along the measured and/or calculated catenary path of the conductor, using the Biot-Savart Law $$B_0(r) = \frac{\mu_0}{4\pi} \int_C \frac{I_0 dc \times r'}{|r'|^3}$$

where:

$B_0$ is the unit vector magnetic field at the sensor location r, in units of ampere/meter (A m$^{-1}$);

r is the vector position of the EMF sensor device, in meters (m);

dc is an infinitesimal line element along C, the catenary path of the suspended conductor wire between two chosen endpoints;

r' is the displacement vector between the line element c and the sensor position r; r'=r−c;

$I_0$ is the unit electric current along the conductor, in Amperes (A); and $\mu_0$ and $\pi$ are constants.

In the case of a single overhead wire or three-phase AC circuit, electrical current along the conductor is determined by the central server 100 by comparing the measured vector magnetic fields (from the EMF sensor device(s)) with the model unit vector magnetic field, $B_0$ that are associated with each apparatus 10. See U.S. Pat. Nos. 6,714,000 and 6,771,058.

For multiple or more-complex assemblages of overhead wires or circuits and multiple EMF monitor locations/units, the same model unit vector magnetic fields are computed by the central server 100 for each conductor/wire path at each EMF sensor location. In this case, the electric currents on each overhead wire are computed using a numerical process that minimizes the root-mean-square error between the measured magnetic field values and model magnetic field values for variable electric currents on each circuit (e.g. linear or non-linear least-squares, gradient descent, and/or related numerical algorithms). See U.S. Pat. No. 8,280,652 B2, which is incorporated herein by this reference.

Once conductor temperature and current loading are determined by the controller 50 and/or the server computers of the central processing facility 100, the recent histories of these variables are also collected (histories within approximately 4 hours) typically by the central processing facility 100. In addition, weather data from local weather sensors or remotely-computed weather models provided by weather data service providers are collected by the central processing facility 100, including solar irradiance/insolation and ambient temperature. Wind speed and direction data may also be collected from local sensors or model data by the central server 100.

By analyzing the physical processes that govern conductor temperature in light of observed/calculated variables associated with real-time performance of the conductor, the central server 100 is able to infer the effective convective cooling potential of the overhead line given present weather conditions and conductor properties.

Four heat transfer phenomena are the primary factors governing the temperature of an overhead conductor: Radiative cooling of the conductor (blackbody cooling), Solar and other radiative heating of the conductor (radiation absorption), Resistive heating of the conductor caused by electrical current ("Joule heating" or "Ohm heating"), and Convective cooling of the conductor, caused by air movement across the surface of the conductor induced by wind or other local convective phenomena.

Empirical equations that describe the heat transfer phenomena listed above are detailed extensively in IEEE Std. 738-2012.

By examining the present and recently observed values of conductor temperature and loading, and present and recent air temperatures and solar irradiances, and using the equations outlined in IEEE Std. 738 or similar reference standards, the central processing facility 100 calculates an effective perpendicular (to the longitudinal axis of the conductor) wind speed that explains the present temperature of the conductor. With this effective perpendicular wind speed in hand, one can calculate a maximum continuous current loading that the conductor could experience while remaining below its Maximum Operating Temperature (MOT), assuming present weather conditions were held constant indefinitely. This maximum current loading is referred to as a Dynamic Line Rating (DLR). Similar calculations using related equations (also described in IEEE Std. 738) can yield short-term or transient current loading ratings that only assume that model loading current is applied for a defined period, for example 5 minutes or 1 hour. These ratings are often referred to as Short-Term Emergency or Transient Ratings, and are typically higher than the equivalent DLRs.

Real-time analysis by the central processing facility 100 of undesirable conductor conditions like icing (formation of ice buildup on the conductor surface), galloping (wind-induced vibration of the conductor leading to large swings in conductor motion, often precipitated by ice formation in windy conditions), and aeolian vibration (wind-induced higher-frequency vibrations that lead to fatigue and fretting of the conductor strands) enables the central server 100 to alert the transmission operation company asset management system to heightened risk of dangerous situations like inter-phase or phase-to-ground conductor flashovers, ice- or vibration-induced mechanical elongation/fatigue/failure/breakage of the conductor(s), and ground-clearance violations. With this real-time information in-hand, agile grid operators will be able to execute Remedial Action Schemes or other procedures to reduce risks to assets and avoid system-level cascading failures.

Other short-term applications of non-contact clearance sensors measurements include evaluation of novel conductor designs, stranding, material compositions, modifications or repair techniques, or surface treatments in comparison to standard or legacy conductor designs. Performance improvements associated with novel tower or insulator structures or conductor geometric arrangements can also be measured, analyzed, and verified in comparison to design claims.

By analyzing as-built performance of overhead conductors over longer periods, engineers and planners can parameterize models of asset health and maintenance/replacement schedules. Long-term field monitoring of conductor sag/clearance, temperature, current loading, and mechanical cycling can help asset owners decide whether conductors can be operated more aggressively than previously assumed, or whether they are reaching end-of-life due to mechanical stresses and associated material degradation (e.g., complete annealing of aluminum conductor strands).

The non-contact clearance sensors 20 used to calculate DLRs can then be used to validate, parameterize, and adjust line rating forecasts for specific transmission pathways. Real-time DLRs, aggregated over weeks, months, or years can help validate and quantify the accuracy and/or uncertainty associated with meteorological data-based DLR forecasts, thereby enhancing confidence and dependability of the forecasted ratings. High accuracy forecasted ratings can factor into scheduled power market generator dispatch, enabling increased use of existing transmission capacity and increase the fraction of electricity originating from lower-priced, low-emission, or renewable generators.

Figure 6:
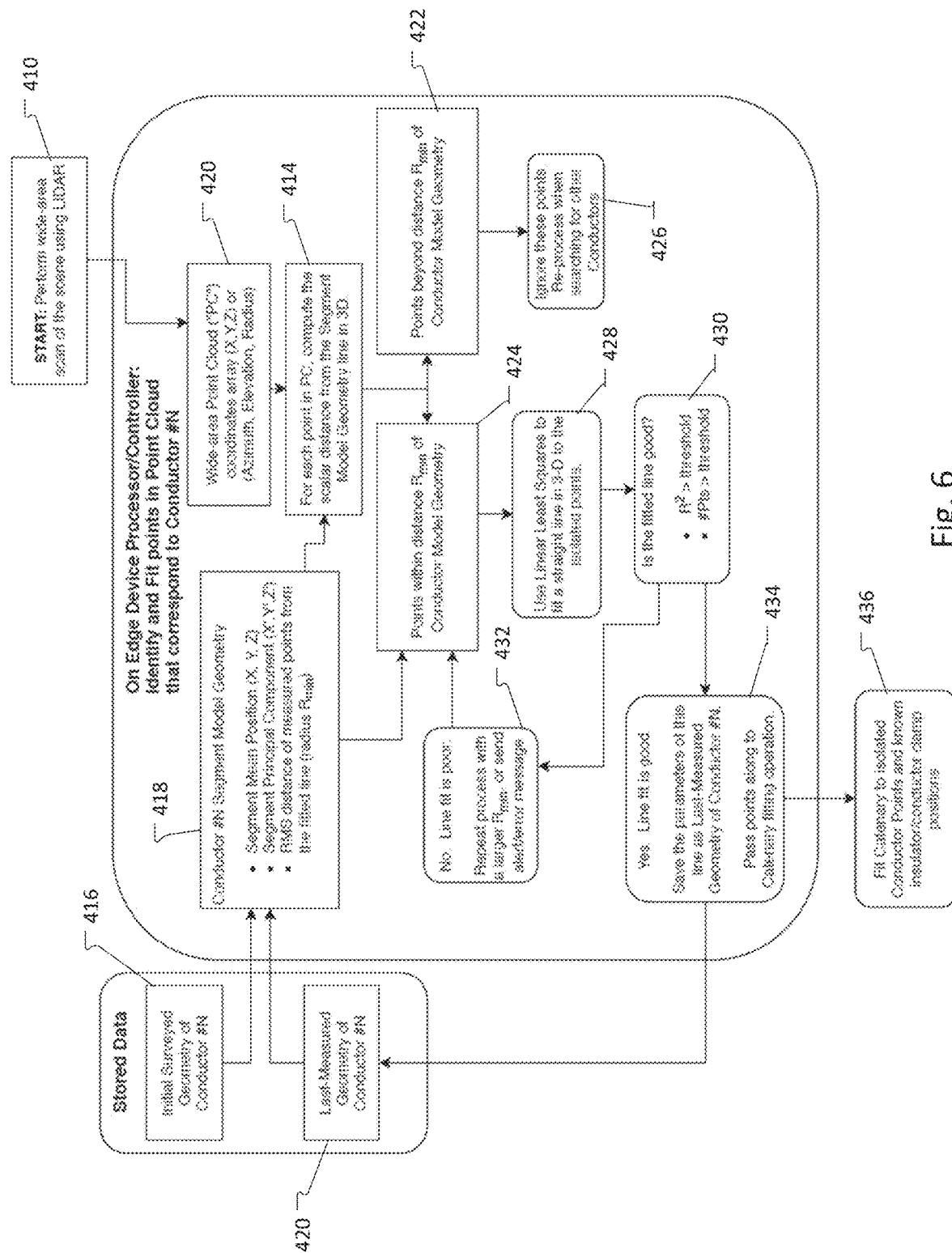
FIG. 6 is a flow diagram showing the process employed by the microcontroller 50 to identify and fit points in a clearance sensor-generated points cloud for a conductor.

FIG. 6 is a flow diagram showing the process employed by the microcontroller 50 to identify and fit points in a clearance sensor-generated points cloud for a conductor.

In more detail, in step 410, a wide-area scan of the scene is performed using the clearance sensors 20 such as LIDAR or RADAR sensors. This produces a wide-area point cloud these can be in Cartesian coordinates (x, y, z) or in spherical coordinates of azimuth, elevation, and radius.

The controller 50 also stores information concerning the initial survey geometry of the conductor in step 416. Typically, this includes the location where the conductor is hung from the insulator string (insulator/conductor clamp positions) and specifically those locations with respect to the location of the clearance sensor 20. This yields a common coordinate system. At the same time, the controller, in step 420, accesses the last-measured geometry of the conductor.

The information from the initial survey (416) and the last measured geometry (420) is used to generate a segment model geometry for that conductor in step 418. This includes the segment mean position in the chosen coordinate system, such as a cartesian coordinate system. It also includes the segment principal component, obtained using Principal Component Analysis. Finally, the model includes the root mean square (RMS) distance of the previously measured points from the fitted line of that conductor. This segment geometry model is then used in step 414 for each point in the point cloud. Specifically, the scalar distance from the segment geometry model is computed.

Points that exist beyond a predetermined distance $R_{min}$, in step 422, are identified. These points are ignored for the assessment of the present conductor but reprocessed when searching for other conductors as indicated in step 426.

On the other hand, in step 424, the points that are within the predetermined distance $R_{min}$ of the conductor geometry model are identified in step 424. From these points, a linear least squares to fit to a straight line in 3 dimensions is performed in step 428. Then, in step 430 it is determined whether the fitted line is satisfactory. That is, it is determined whether the fitted line a good representation of the possible conductor.

If the conductor is a poor fit then the process is repeated with a larger $R_{min}$ or an error message is sent in step 332.

On the other hand, if the line is determined to be a satisfactory fit, then the parameters of this line are saved as the last type and measured geometry for that conductor. The points are then passed to a catenary fitting operation in step 434. Finally, a catenary is fitted to the isolated conductor points and known insulator/conductor clamp positions in step 436.

Figure 7:
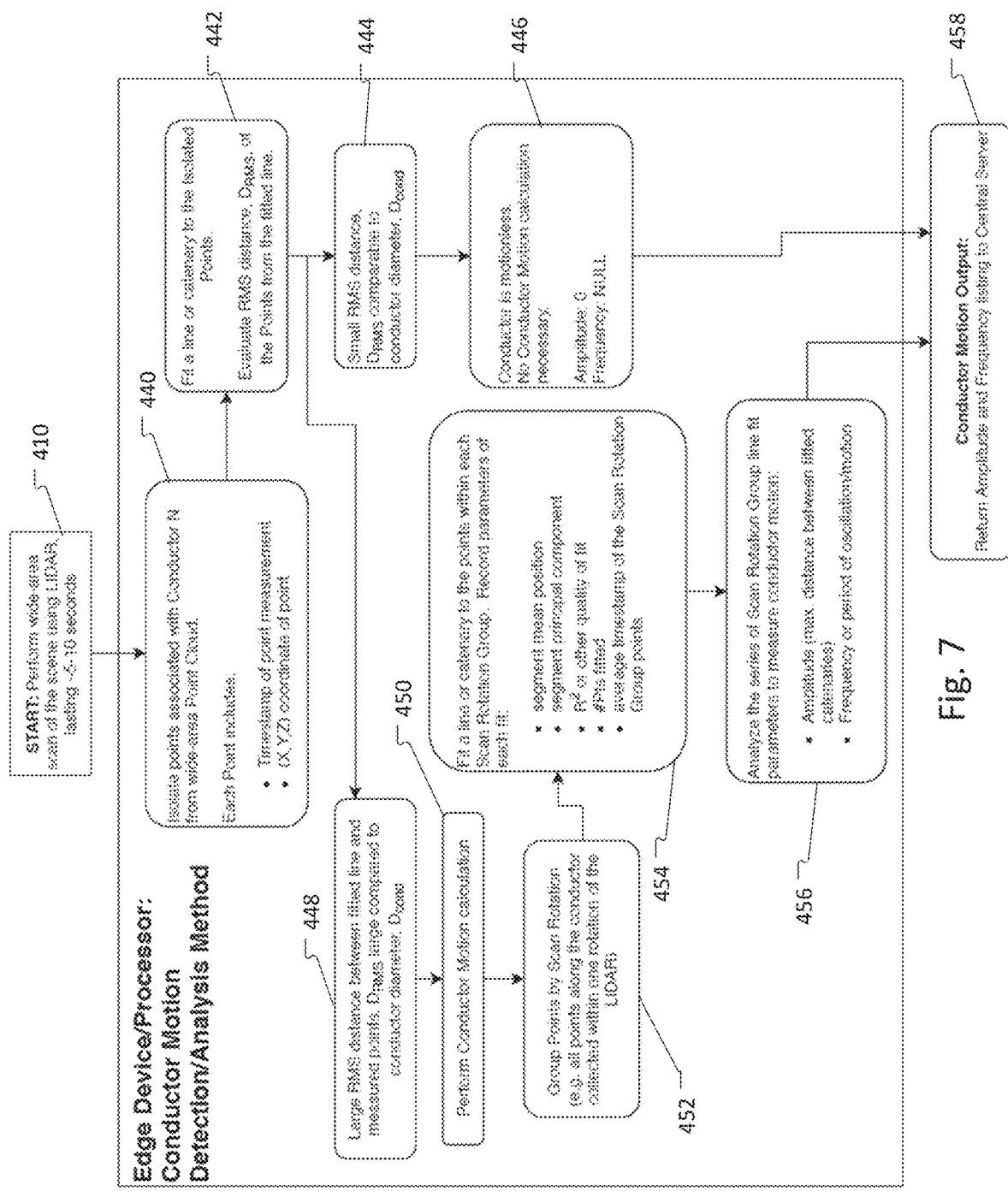
FIG. 7 is a flow diagram showing the process employed by the microcontroller 50 to identify and analyze conductor motion.

FIG. 7 is a flow diagram showing the process employed by the microcontroller 50 to identify and analyze conductor motion.

In more detail, in step 410, a wide-area scan of the scene is performed using the clearance sensors 20 such as LIDAR or RADAR sensors. This produces a wide-area point cloud these can be in Cartesian coordinates (x, y, z) or in spherical coordinates of azimuth, elevation, and radius. The scan, however, is different from the previous scanned insofar as the scan could last possibly 5 to 10 seconds or longer. The result is a point cloud with a timestamp measurement for each of the points.

In step 440, the points of this generated point cloud are associated with one of the conductors. Each point is a combination of that point's coordinate and a timestamp indicating when that point was measured.

In step 442, a line or catenary is fitted to the isolated points. The RMS distance $D_{rms}$ of the points from the fitted line is then determined.

In step 444, it is assessed whether or not the distance $D_{rms}$ is small. Specifically, is the $D_{rms}$ comparable to the conductor diameter. For example, if $D_{rms}$ is less than twice the conductor diameter, then, in step 446, it is concluded that the conductor is motionless or near motionless. This conclusion is then recorded in step 458.

On the other hand, if a large RMS distance exists between the fitted line and the measured points, such as $D_{rms}$ of greater than twice the conductor diameter, in step 448 then the conductor motion calculation is performed in beginning in step 450.

Specifically, a group of points for a single scan of the LIDAR clearance sensor 20, for example, are collected in step 452. A catenary is then fitted to those points within each data collection period of the clearance sensor 20. For each of these sets of points, the segment mean position, the segment principal component, the quality of fit, the number of points fitted, and the average time stamp are recorded in step 454. This analysis is then done for each of the series of scans by the clearance sensor in step 456. From this information, the amplitude, i.e., the maximum distance between the fitted catenaries, is calculated. Also, the frequency or period of oscillation or motion is calculated. This information is then stored in step 458 and possibly sent to the central server 130.

Figure 8:
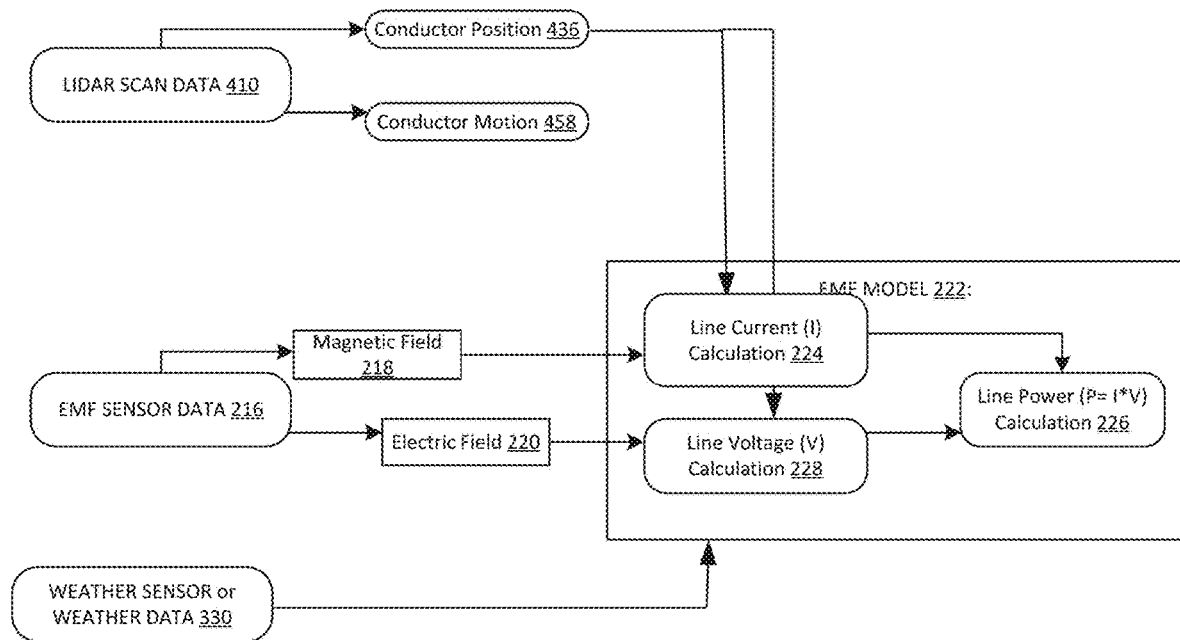
FIG. 8 illustrates a method for modeling a transmission line from EMF sensor and clearance sensor information.

FIG. 8 is a flow diagram illustrating a process employed by the microcontroller 50 and/or the central processing facility 100 to use information from the clearance sensors 20 to improve the EMF measurements from the EMF sensors: magnetic field sensor 42 and the electric field sensor 44.

In general, the clearance sensor measured conductor position in 3 dimensions allows for the creation of a dynamic and more accurate 3-dimensional EMF model in comparison to an EMF model that relies on a fixed or approximate conductor geometry. This precise geometry facilitates the calculations of the line current, voltage, and power based on the optimized an EMF model, which takes magnetic and electric field data and conductor geometry as inputs.

In general, if the geometry of the conductors is known with respect to the EMF sensors 42, 44 then that geometry information can be used to improve the measurement of the electromagnetic fields from those conductors. This arises because the detected magnetic/electric fields are a function of the square of the distance between the field sensors and the series of infinitesimal segments along the length of the conductor shape 82.

In more detail, knowing the dynamic and three-dimensional conductor geometry improves the model that maps observed EMF signals to conclusions about current, voltage, and power flow on the monitored transmission line. This improvement is measured in comparison to a static and time-invariant conductor shape model, whether in two-dimensional cross-section or in three-dimensions, that fails to account for how changes in conductor shape and ground clearance affect outbound EMF signal amplitudes and phase angles. The clearance sensor measured conductor position data in 3-dimensions allows for the creation of dynamic and more accurate 3-D EMF model, in comparison to an EMF model that relies on fixed or approximate conductor geometry. Calculations of line current (I), voltage (V) and power (P) are based on the EMF model, which takes magnetic and electric field data and conductor geometry as inputs.

Specifically, one or more clearance sensors, e.g., LIDAR sensors, generate scan data 410 which is sent to the microcontroller 50 and/or the central processing facility 100. Preferably the data specifies the position of the conductors in the three spatial dimensions as described in FIG. 5, for example, and conductor motion as described in FIG. 6. From this data, the microcontroller 50 and/or the central processing facility 100 resolve the conductor position 436 and any conductor motion 458. This information is then fed to an EMF model 222 that is employed by the microcontroller 50 and/or the central processing facility 100.

At the same time, EMF sensor data 216 from EMF sensors including the magnetic field sensor 42 and the electric field sensor 44 are used to calculate the magnetic field magnitude 218 and the electric field magnitude 220. This information is provided to the EMF model 222.

The EMF model 222 uses the magnetic field and the conductor geometry information and to perform a calculation 224 that determines the three-phase or single-phase AC line current by dividing the measured vector magnetic field values by model unit values of the magnetic field. These model unit values are complex numbers that represent the modeled magnetic field phasors (Euler's formula notation of sine waves) that would be present at the sensor locations that would be produce by 1.0 Amperes rms of electric current on the monitored conductors with known phase shifts associated with the phase order of the circuit (e.g. "ABC", "ACB", etc). These model unit phasors are computed as the vector sum of the magnetic field vectors produced at the sensor position for a series of infinitesimal segments of the conductor along its three-dimensional path (path integral), using the vector cross-product formula known as Biot-Savart Law.

The EMF model 222 uses the measured electric field to calculate the line voltage and phase offset between the line voltage and current by the use of Coulomb's Law 228. The measured conductor geometry information is used to create a 3-dimensional charge distribution model that follows the path of the conductor. The model electric field at the sensor position is computed using a path integral over the infinitesimal elements of charge distribution along the conductor shape, and the Method of Image Charges is used to account for the presence of a ground plane G formed by the earth below the monitored scene. Finally, from this information, the line power is determined step 226 as the product of the complex-number line current and line voltage. From the complex-number power, P, that results, the real power (watts, or REAL(P)), reactive power (vars, or IMAG(P)), apparent power (volt-amperes, ABS(P)), or power factor (the ratio of real power to apparent power) can be subsequently calculated.

In a preferred embodiment, weather sensor information or weather data 330 is also used by the EMF model 222 to perform the line power calculation 226. In more detail, the microcontroller 50 and/or the central processing facility 100 further uses information from temperature sensor 32, humidity sensor 34, and the anemometer 36 to improve the accuracy of the EMF model 222. For example, the electrical response of analog-to-digital converters that convert the raw analog sensor data from the magnetic and electric-field transducers typically have some dependence on temperature, resulting in biases that can be corrected when temperatures are known. In another example, it is well known that precipitation that results in wet soil and vegetation tends to steer and intensify the electric field gradient that is produced by energized high-voltage conductors. During or following periods of precipitation observed by the weather sensor or weather data, dynamic corrections to the amplitude, phase, and vector direction of the electric field model can be made in correlation with observed changes in the sensor values caused by local wetness, resulting in a more-precise and accurate determination of line power using the EMF model and sensor data.

Figure 9:
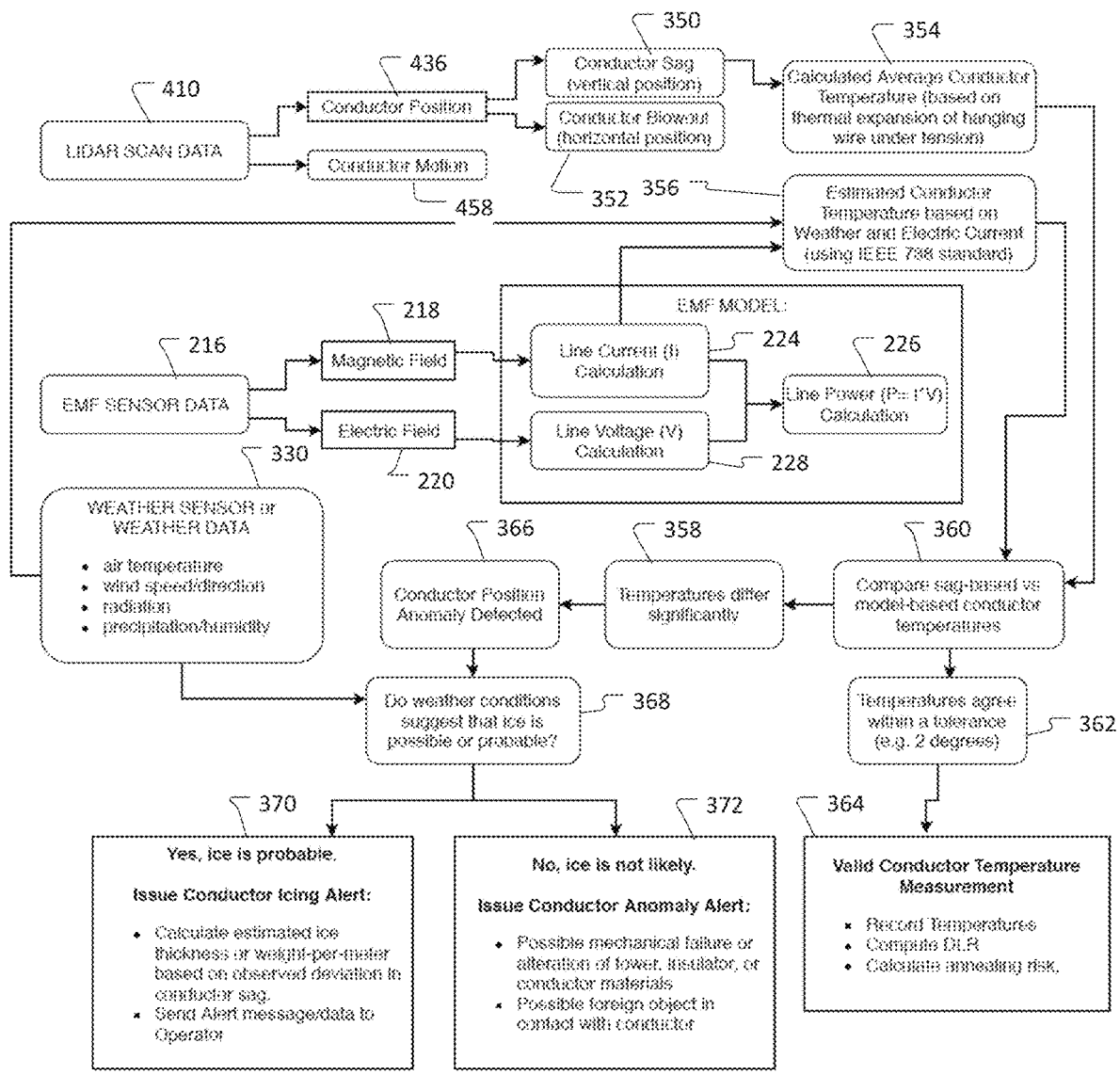
FIG. 9 illustrate a method for modeling a transmission line from EMF sensor and clearance sensor information to determine whether a possible anomaly exists.

FIG. 9 is a flow diagram showing how the microcontroller 50 and/or the central processing facility 100 function as a conductor-Sag-As-Anomaly-Indicator and further possibly detect ice accumulation on the conductors.

In general, the clearance sensors 20, such as LIDAR, produce measured conductor positions that are used to compute an average conductor temperature in the span or string section. This calculation or measurement process assumes the thermal expansion of a dry and clean conductor hanging under tension. This sag-based temperature is then compared with a conductor temperature estimate from the EMF-based line current (which causes resistive heating) and weather sensor or weather data inputs according to a different measurement process. If the sag-based and weather/EMF-based conductor temperatures disagree by more than some threshold value, this suggests an anomalous condition, such as ice formation on the conductor (this determination can be aided by temperature and precipitation data), foreign object contact, or failure or alteration of the mechanical structure/insulator/conductor system that suspends the conductor.

In more detail, clearance sensor, e.g., LIDAR scan, data 410 is generated by the clearance sensor 20 and the microcontroller 50 and/or the central processing facility 100. The clearance sensor generates the raw scan data. Then the microcontroller 50 and/or the central processing facility 100 using further information such as the known orientation of the one or more clearance sensors with respect to the transmission line determine the three-dimensional conductor geometry. From this data, the microcontroller 50 and/or the central processing facility 100 resolve the conductor position 436 and any conductor motion 458. Preferably the position and motion geometry of the transmission line are resolved in three dimensions.

This information is used to resolve a conductor sag or vertical position step 350 and the lateral movement of the conductor or conductor blow out or horizontal position in step 352. From this information, the calculated average conductor temperature based on the thermal expansion of the hanging wire under tension is calculated in step 354.

Often at the same time, EMF sensor data 216 from the EMF sensors including the magnetic field sensor 42 and the electric field sensor 44 are used to calculate the magnetic field magnitude 218 and the electric field magnitude 220. This information is provided to the EMF model 222 that is employed by the microcontroller 50 and/or the central processing facility 100.

Here, the EMF model 222 uses the magnetic field a perform a line current calculation 224. Electric field is used to calculate the line voltage 228. From this information, the line power calculation 226 can be performed in order to determine the power being conducted by the monitored conductor.

In a preferred embodiment, weather sensor information or weather data 330 is used to independently generate an estimate of the conductor temperature based on the weather information and the electric current from the EMF model 222 in step 356. The weather information is typically derived from temperature sensor 32, humidity sensor 34, and the anemometer 36 along with weather information from weather services. The current heats the conductor while wind, humidity, and air temperature affect its rate of heat dissipation and thus cooling.

In step 360, the microcontroller 50 and/or the central processing facility 100 compare(s) the sag based versus the model based conductor temperatures. Specifically, the clearance sensor data provides one basis for the conductor temperature in step 354 whereas in step 356, another estimate of the conductor temperature is generated based on the current through the conductor and the weather.

The two estimated conductor temperatures obtained from the independent sensor-based methods can be compared in step 362 by the microcontroller 50 and/or the central processing facility 100. If there is a similarity within a few degrees Celsius, there is a mutually reinforced measurement. This validated conductor temperature is recorded in step 364.

On the other hand, if they disagree as in step 358, the measurement timestamp is flagged as an anomalous condition requiring the attention of a human- or algorithm-based analysis process that may identify and alert grid operators to mechanical, structural, or electrical problems, or other anomalous conditions, that may degrade asset health in step 366. If anomalous differences in conductor temperature are observed between multiple independent temperature-estimating methods over an extended period of time, it may be an indication of conductor elongation, strand breakage, insulator or shackle failure, structure foundation subsidence, or other reason for inspection, maintenance, or replacement.

In the preferred embodiment, further processing is performed in order to determine whether or not ice accumulation on this conductor is possible or another anomaly exists.

Specifically, in step 368, the information from the weather sensors and/or weather data from a weather service, such as air temperature, wind speed and direction, radiation, and precipitation/humidity are accessed from the weather sensors or remotely in step 330. Next, a determination of whether or not ice is likely or unlikely is made.

If ice is determined to be probable, then a conductor icing alert is generated. Based on the observed deviation in conductor sag, the weight and the estimated ice thickness per meter of conductor length, is generated in step 370.

On the other hand, if it is determined that ice is unlikely, then a conductor anomaly alert is generated. Such anomaly could be possibly due to mechanical failure or alteration of the tower, crossarm, insulator, or conductor materials. Possibly there is a foreign object, such as a tree or another utility pole, in contact with the conductor. This warning is issued in step 372.

Figure 10:
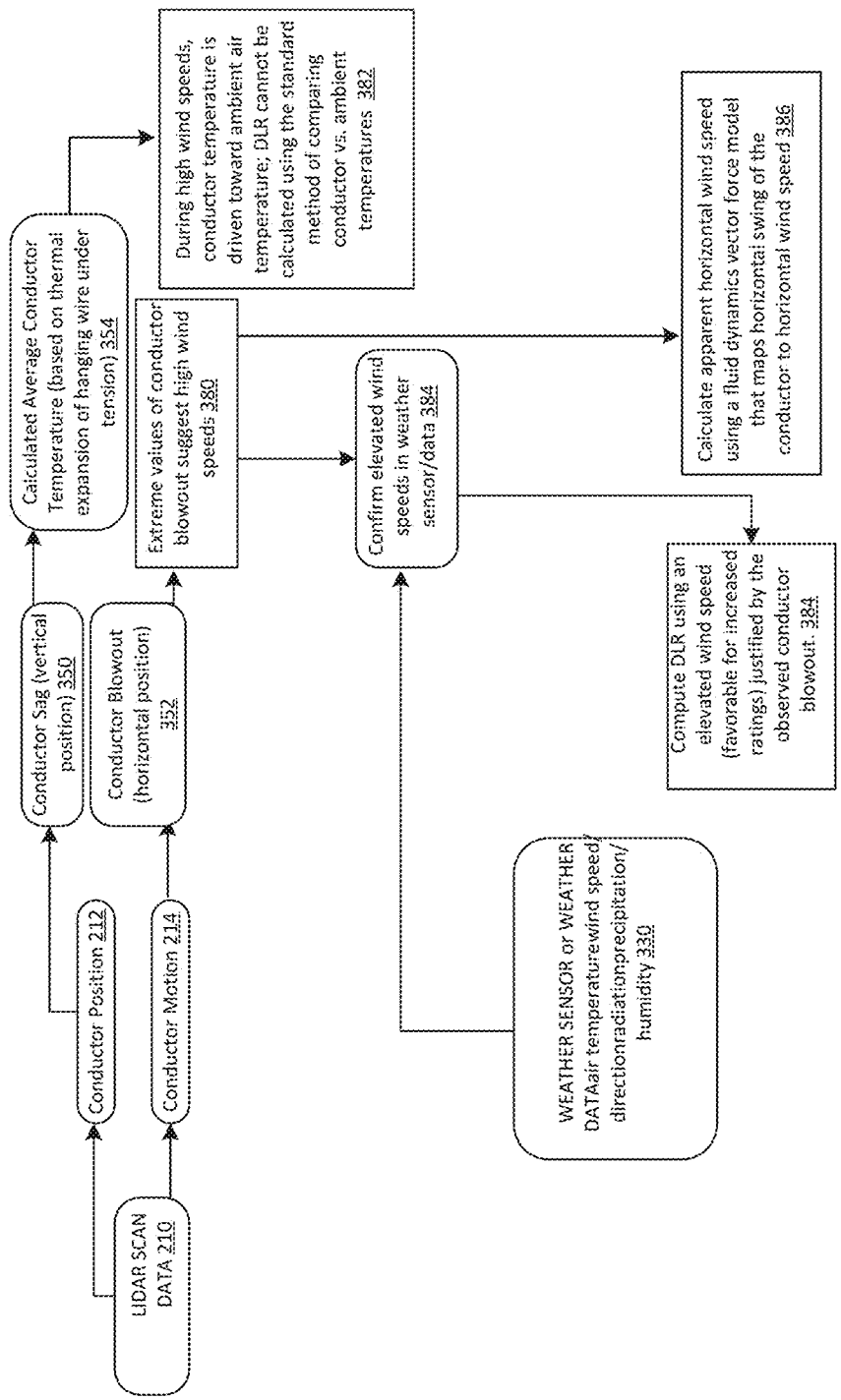
FIG. 10 illustrate a method using a model of a transmission line from clearance sensor information to assess and validate windspeed and subsequently calculate a dynamic line rating from the apparent wind speed and other factors.

FIG. 10 is a flow diagram showing how the microcontroller 50 and/or the central processing facility 100 employ the conductor-as-anemometer analysis. Here, the horizontal position of the conductor away from the neutral hanging position is used to infer knowledge about local horizontal wind speeds affecting the conductor position and temperature.

Horizontal conductor motion or displacement induced by wind is commonly referred to as "blowout". When measured by the clearance sensor 20, the observed blowout can be used to compute an effective perpendicular horizontal wind speed using a fluid dynamics model. This measure of wind speed can be used to complement calculated wind speeds based on conductor temperature in comparison with air temperature (the standard method employed when calculating DLR), or directly from weather/meteorological observations. This independent evaluation of wind speed can come into particular usefulness when conductor temperatures are near ambient air temperature, which results in large uncertainties in the standard method of computing DLR, or when weather sensor or meteorological observations are otherwise unavailable or unreliable. In these instances, a conservative estimate of the blowout-based wind speed can be used to compute DLR as a substitute for the standard method.

In more detail, clearance sensor, e.g., LIDAR scan, data 210 is generated by the clearance sensor 20. From this data, the microcontroller 50 and/or the central processing facility 100 resolve the conductor shape and position 212 and any conductor motion 214, based on time-series analysis of multiple conductor position scans in rapid succession. Typically, the clearance sensor generates the raw scan data. Then the microcontroller 50 and/or the central processing facility 100 using further information such as the known orientation of the one or more clearance sensors with respect to the transmission line to determine the three-dimensional conductor geometry.

This information is used to resolve a conductor sag or vertical position in step 350 and the lateral movement of the conductor or conductor blowout or horizontal position in step 352. From this information, the overall length of the hanging conductor can be computed and the average conductor temperature based on the thermal expansion of the hanging wire under tension is calculated in step 354.

As part of a potential confirmation of the wind speed, the dynamic line rating cannot be calculated because the high wind speeds will cool the conductor to the extent that its temperature is indistinguishable from ambient air temperature given the accuracy/uncertainty of the sag-to-temperature measurement method. Moreover, the dynamic line rating cannot be calculated with acceptable certainty using the standard methods when conductor temperatures are within a few degrees of ambient air temperature. Instead, a minimum "temperature rise", or conductor temperature above ambient, is required before the calculation of apparent perpendicular wind speed, and subsequent DLR calculation, can be performed with uncertainty low enough to be rendered operationally useful. This is because the "temperature rise" term appears in the denominator of the derivation of apparent wind speed, and leads to expanding uncertainty of the output DLR values for fixed absolute uncertainty of temperature-rise values near zero (i.e., if temperature rise is near zero, and temperatures of both ambient air temperature and conductor temperature can only be determined within 2 degrees, then wind speed and DLR outputs have large values with enormous uncertainties).

On the other hand, the monitoring of the conductor position can be used to detect extreme wind events in step 380. This information can be confirmed against the weather sensor information or weather data 330. Typically, this weather information is derived from temperature sensor 32, humidity sensor 34, and the anemometer 36 along with weather information from weather services.

The apparent horizontal wind speed using a fluid dynamics vector force model is used to map the horizontal swing of the conductor to horizontal wind speed in step 386. Then, the DLR is computed using an elevated wind speed (which is favorable for increased ratings) justified by the observed conductor blowout 384.

Figure 11:
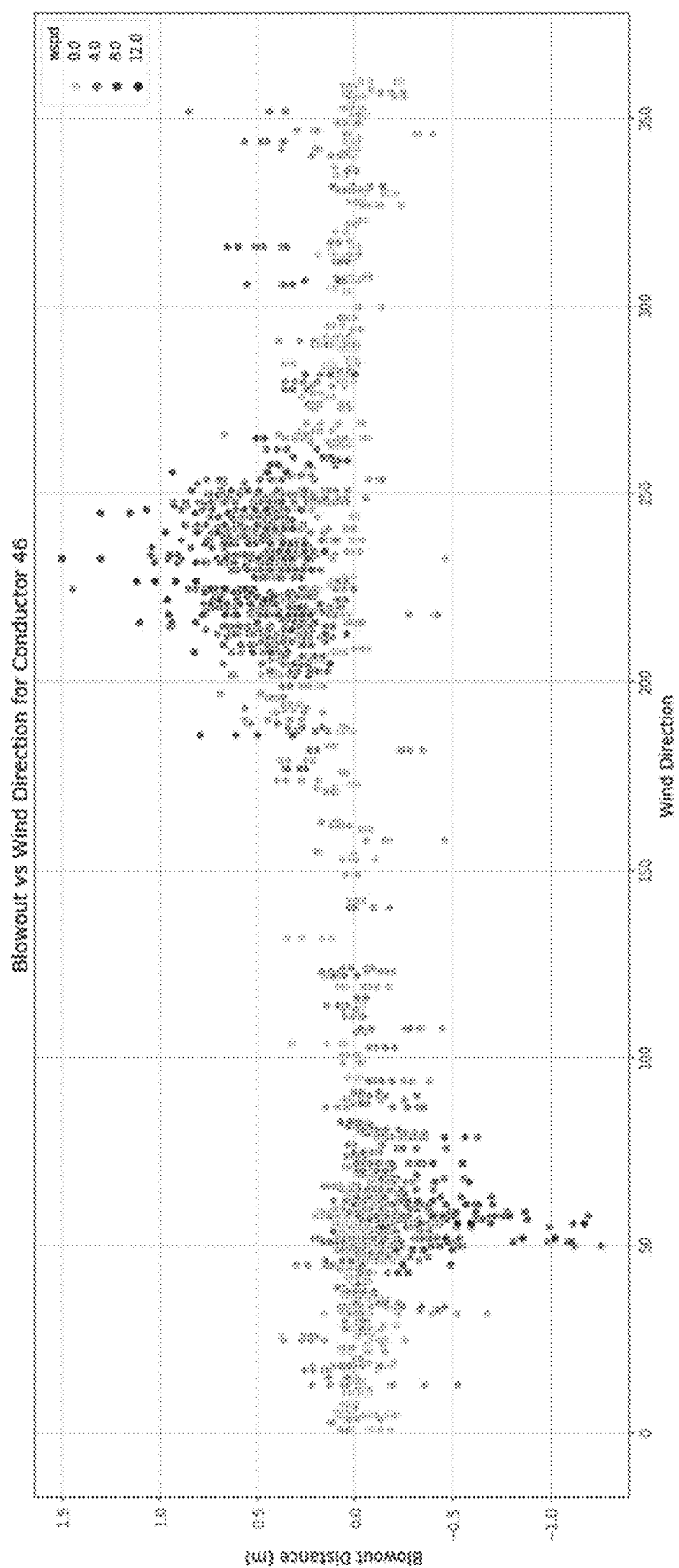
FIG. 11 is a scatter plot of blowout distance in meters and a function of wind direction and different windspeeds.

FIG. 11 is a scatter plot of blowout distance in meters as a function of wind direction and different windspeeds. The example conductor is oriented along a heading of about −40 degrees, or North-Northwest (with 0 degrees indicating North, and 90 degrees indicating East).

It illustrates the usefulness of the Blowout-As-Wind-Speed indicator method. A clear sinusoidal dependence on the wind direction is present. Also, higher wind speeds lead to larger blowout levels. As shown, when the wind blows along the conductor's length, with wind incidence angles near 0 and 180 degrees, the blowout is very small. When it blows across, the blowout increases, and the directionality is very clear.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method for measuring electric power flow along one or more conductors, comprising:
    measuring an electric and/or magnetic field of the one or more conductors;
    measuring a position of the conductors in a span between transmission line towers with a range finding system; and
    using the position to improve an estimation of the power being transmitted by the conductors from the electric and/or magnetic field measurement.

2. A method as claimed in claim 1, wherein the position of the conductors is measured with a LIDAR based clearance sensor.

3. A method as claimed in claim 1, wherein the position of the conductors is specified in three dimensions.

4. A method as claimed in claim 1, wherein the inter-conductor spacing of several conductors is computed from multiple three-dimensional conductor position specifications.

5. A method as claimed in claim 1, further comprising using weather sensor information or weather data to adjust the electric field model used to estimate the power being transmitted by the conductors.

6. A method as claimed in claim 1, further comprising using an electromagnetic field model with the measured position to determine power conducted by the conductors.

7. A system for generating a power measurement, comprising:
    one or more electromagnetic field sensors for measuring an electric and/or magnetic field of one or more conductors;
    a range finding system measuring a position of the conductors in a span between transmission line towers; and
    a computer that uses the measured position to improve an estimation of the power being transmitted by the conductors from the electric and/or magnetic field measurement.

8. A method for detecting a possible anomaly in connection with a transmission line, comprising:
    measuring an electric and/or magnetic field near a transmission line;
    characterizing a weather surrounding the transmission line;
    estimating the conductor temperature of the transmission line using a first measurement process based on the weather and the measured electric and/or magnetic field;
    measuring a position and/or sag of the transmission line;
    estimating the conductor temperature of the transmission line using a second measurement process from the measured position/sag; and
    determining an anomalous condition based on comparison of the conductor temperatures derived from the first and second measurement processes.

9. A method as claimed in claim 8, wherein the position of the transmission line is measured with a LIDAR based clearance sensor.

10. A method as claimed in claim 8, wherein the position of the transmission line is specified in three dimensions.

11. A method as claimed in claim 8, further comprising using weather sensor information or weather data to determine the weather.

12. A method as claimed in claim 8, further comprising estimating the wind conditions based on the measured position.

13. A method as claimed in claim 8, further comprising:
   measuring wind speed; and
   comparing the measured wind speed to the estimated wind speed to assess a status of the transmission line.

* * * * *